US007696783B2

(12) United States Patent
Krishnan (10) Patent No.: US 7,696,783 B2
(45) Date of Patent: Apr. 13, 2010

(54) LOGIC MODULES FOR SEMICONDUCTOR INTEGRATED CIRCUITS

(75) Inventor: Rohini Krishnan, Folsom, CA (US)

(73) Assignee: NXP B.V., Eindhoven (NL)

( * ) Notice: Subject to any disclaimer, the term of this patent is extended or adjusted under 35 U.S.C. 154(b) by 90 days.

(21) Appl. No.: 12/065,634

(22) PCT Filed: Sep. 4, 2006

(86) PCT No.: PCT/IB2006/053100

§ 371 (c)(1),
(2), (4) Date: Apr. 24, 2008

(87) PCT Pub. No.: WO2007/029167

PCT Pub. Date: Mar. 15, 2007

(65) Prior Publication Data

US 2008/0224732 A1  Sep. 18, 2008

(30) Foreign Application Priority Data

Sep. 5, 2005  (EP) .................................. 05108122

(51) Int. Cl.
*H03K 19/173* (2006.01)
*G06F 7/50* (2006.01)
(52) U.S. Cl. ........................... 326/40; 326/38; 327/407; 708/670
(58) Field of Classification Search ............. 326/38–41; 327/407; 708/670
See application file for complete search history.

(56) References Cited

U.S. PATENT DOCUMENTS 5,748,009 A  5/1998 Bertolet et al.
2003/0001613 A1*  1/2003 Nakaya ........................ 326/38

FOREIGN PATENT DOCUMENTS

EP  0573175 A2  12/1993
WO  9215152 A1  9/1992
WO  0106657 A1  1/2001
WO  2004075410 A1  9/2004

OTHER PUBLICATIONS

Holdsworth, B Ed; et al "The Multiplexer as a Logic Function Generator" Ferrites. Physical Properties of Ferrimagnetic Oxides in Relation to Their Technical Applications, Eindhoven, Philips Technical Library, NL, 1993, pp. 222-231.

* cited by examiner

*Primary Examiner*—Daniel D Chang (57) ABSTRACT

A logic module (400) that is capable of implementing datapath and random logic (command Z in block 42) uses control logic for selectively coupling one or more of the input terminals (10, 12, 14, 16, 18, 40) to the at least one output terminal (20). The control logic comprises a plurality of logic elements (26, 28, 30, 32) arranged to generate a first set of two-input logic functions (f, (a, b)) and a programmable inverter (36) arranged to generate a second set of two-input logic functions, the second set of two-input logic functions being the complement functions of the first set of two-input logic functions. SRAM memory cells (4 bit memory batch (38)) may be used for configuration purposes, realizing a compact logic module or block that is also re-programmable.

14 Claims, 7 Drawing Sheets

| Function | CM0 | CM1 | CM2 | CM3 | Y |
|---|---|---|---|---|---|
| 1. F=0 | 0 | 0 | X | 0 | 0 |
| 2. F=1 | 0 | 0 | X | 1 | 0 |
| 3. F=a | 1 | 1 | X | 1 | 1 |
| 4. F=$\bar{a}$ | 1 | 1 | X | 0 | 1 |
| 5. F=b | 0 | 1 | 0 | 0 | 0 |
| 6. F=$\bar{b}$ | 0 | 1 | 0 | 1 | 0 |
| 7. F=a.b | 0 | 0 | 1 | 0 | 1 |
| 8. F=a.$\bar{b}$ | 0 | 0 | 0 | 0 | 1 |
| 9. F=$\bar{a}$.b | 1 | 0 | 1 | 0 | 1 |
| 10. F=$\bar{a}.\bar{b}$ | 1 | 0 | 0 | 0 | 1 |
| 11. F=a+b | 1 | 0 | 0 | 1 | 1 |
| 12. F=a+$\bar{b}$ | 1 | 0 | 1 | 1 | 1 |
| 13. F=$\bar{a}$+b | 0 | 0 | 0 | 1 | 1 |
| 14. F=$\bar{a}+\bar{b}$ | 0 | 0 | 1 | 1 | 1 |
| 15. F=a⊕b | 0 | 1 | 0 | 0 | 1 |
| 16. F=$\overline{a⊕b}$ | 0 | 1 | 0 | 1 | 1 |

LOGIC MODULES FOR SEMICONDUCTOR INTEGRATED CIRCUITS

This invention relates to logic modules for semiconductor integrated circuits, and in particular to multiplexer based logic modules for use in programmable hardware such as Field Programmable Gate Arrays (FPGAs).

Various kinds of programmable hardware solutions exist in the market today. The different types are broadly classified as Programmable Array Logic, (PAL) which contains a programmable AND plane followed by a fixed OR plane, Programmable Logic Arrays (PLAs), which contain a programmable AND plane followed by a programmable OR plane, Field Programmable Gate Arrays (FPGAs), for which the main switch technologies are SRAM and anti-fuse, and Complex Programmable Logic Devices (CPLDs) in which the main switch technologies are floating gate transistors like those used in Erasable Programmable Read-Only Memory (EPROM) and Electrically Erasable Programmable Read-Only Memory (EEPROM) devices.

SRAM-based programmable solutions are in-circuit programmable (unlike EPROM which is out-of-circuit re-programmable) and are thus advantageous when compared to anti-fuse technologies that may only be programmed once.

An SRAM-based Configurable Logic Block (CLB) comprises look-up-tables (LUTs). An LUT is a data structure, usually an array or associative array, used to replace a runtime computation with a simpler lookup operation. The speed gain can be significant, since retrieving a value from memory is often faster than undergoing an expensive computation. Conventionally, a LUT within an SRAM-based CLB is a 1-bit wide memory, its memory address lines being logic block inputs and the 1-bit memory output being the LUT output.

A LUT with K inputs corresponds to a $2^K \times 1$ bit memory and using this a user can realise a K-input logic function by programming the truth-table of the logic function directly into memory.

An alternative method of realising a CLB is to use multiplexers as the logic function generators instead of LUTs. The inputs to the multiplexer and the selection signal may come from the data signals which can be connected from the interconnect depending on the function it needs to perform. A number of manufacturers have used this in one-time programmable commercial solutions using antifuses.

The basis of multiplexer logic is Shannon's expansion theorem which states that any logic function can be expanded into two terms, the first with a particular variable set to 1, and multiplied by that variable, and the second with it set to 0, and multiplied by the inverse of that variable. This will be made clearer from the example below. A multiplexer may then be used, with the variable selecting between the terms as inputs to the multiplexer. By repeating Shannon's theorem with each of the variables involved in the expression, the logic function can be reduced to its canonical form and implemented using multiplexer logic.

For example, a function f may be defined as: $f(a,b,c,d)=ab+\bar{b}c+d$

When b is zero, $f_{b=0}=a.0+1.c+d=c+d$

When b is one, $f_{b=1}=a.1+0.c+d=a+d$

Using Shannon, $f(a,b,c,d)=bf_{b=1}+\bar{b}f_{b=0}=b(a+d)+\bar{b}(c+d)$.

Using Shannon within the brackets, $f(a,b,c,d)=b(a+\bar{a}d)+\bar{b}(c+\bar{c}d)$.

Figure 1:
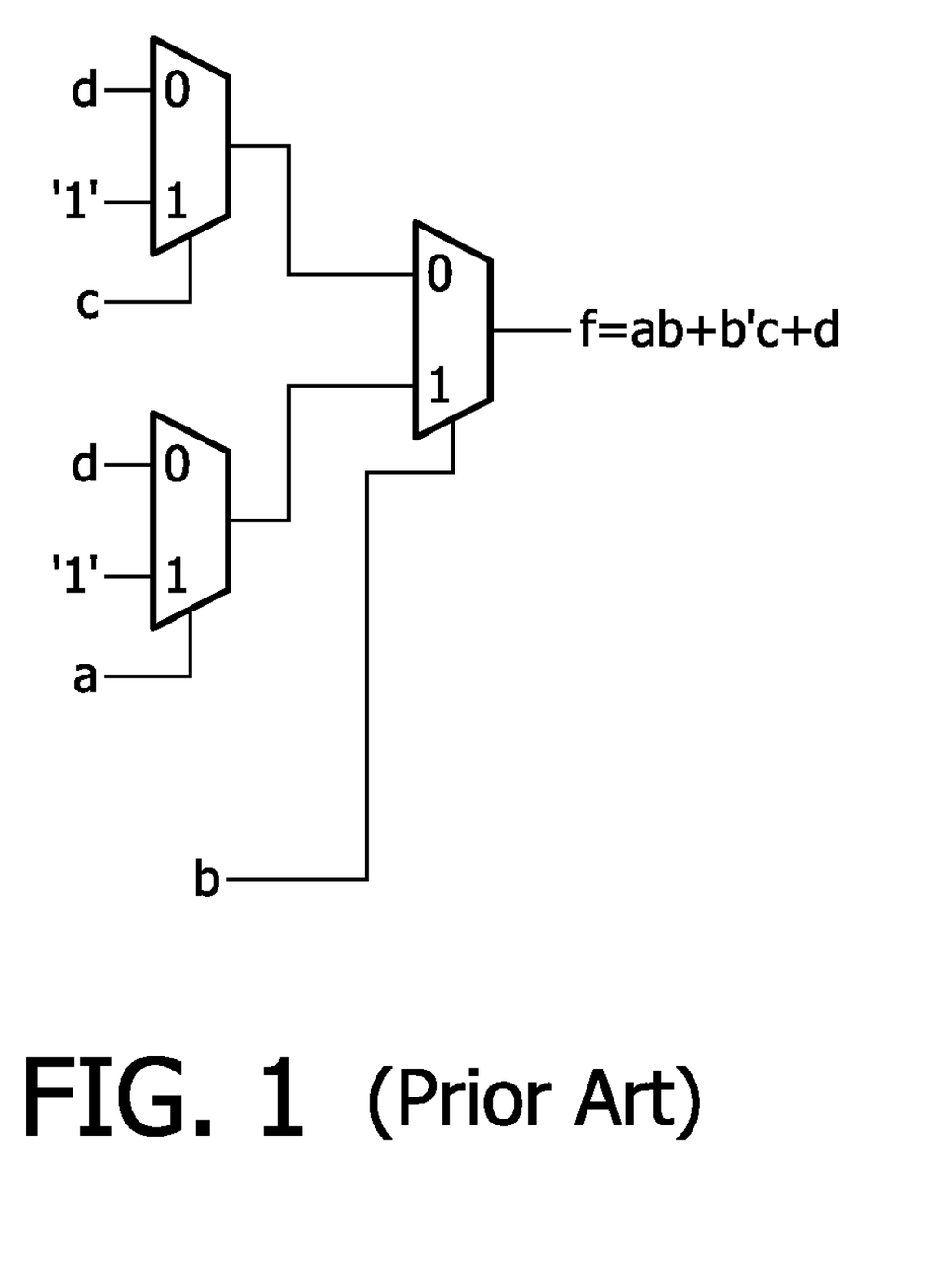
FIG. 1 is a schematic diagram of the logic function $f(a,b,c,d)=ab+b'c+d$ implemented using multiplexer based logic.

Thus, the logic function $f(a,b,c,d)=ab+\bar{b}c+d$ can be implemented using multiplexer based logic as shown in FIG. 1.

To enable any logic function to be mapped onto a programmable multiplexer arrangement, the interconnect architecture needs significant flexibility. This results in a considerable interconnect area associated with the multiplexer-based logic block, even though the logic block itself is compact. To limit the interconnect area, multiplexer-based FPGAs are antifuse-based. The disadvantage with these solutions is that they are only one-time programmable as a result of using antifuses.

Thus, it is desirable to reduce the interconnect flexibility required by the multiplexer-based logic block. If the interconnect flexibility can be sufficiently limited, SRAM memory cells may be used instead of interfuses for configuration, thus realising a compact logic block that is also re-programmable.

According to an aspect of the invention, there is provided a logic module comprising: a plurality of input terminals; at least one output terminal; and control logic between the input terminals and the at least one output terminal, the control logic comprising a plurality of multiplexer logic elements programmable to generate each of a first set of at least two-input logic functions and an inverter programmable to produce from the first set, a second set of at least two-input logic functions which are the complement functions of the first set of at least two-input logic functions.

SRAM memory cells may be used for configuration purposes, realising a compact logic block that is also re-programmable.

The first and second set of at least two-input logic functions may comprise all possible two-input logic functions.

The logic module may also be further arranged to complete 1-bit addition. It can therefore implement a bit-slice of datapath functions.

According to another aspect of the invention, there is provided a semiconductor integrated circuit comprising at least one logic module of the invention.

According to yet another aspect of the present invention, there is provided a method of generating at least two-input logic functions from control logic, the control logic comprising a plurality of multiplexer logic elements and an inverter.

The invention may also be used for providing embedded re-configurability in System-On-Chips.

When compared to prior art MUX-based logic blocks, the invention provides a MUX-based logic block that greatly simplifies the interconnection network by demanding less connectivity.

Embodiments of the invention will now be described, by way of example only, with reference to the following diagrams wherein.

The present invention is now to be further explained by way of describing various embodiments of the invention. While the present invention is susceptible of embodiment in various forms, there are described and shown in the drawings presently preferred embodiments. These embodiments are provided so that the disclosure will be thorough and complete, and will fully convey the scope of the invention to those skilled in the art. Like reference numerals refer to like elements throughout.

Figure 2:
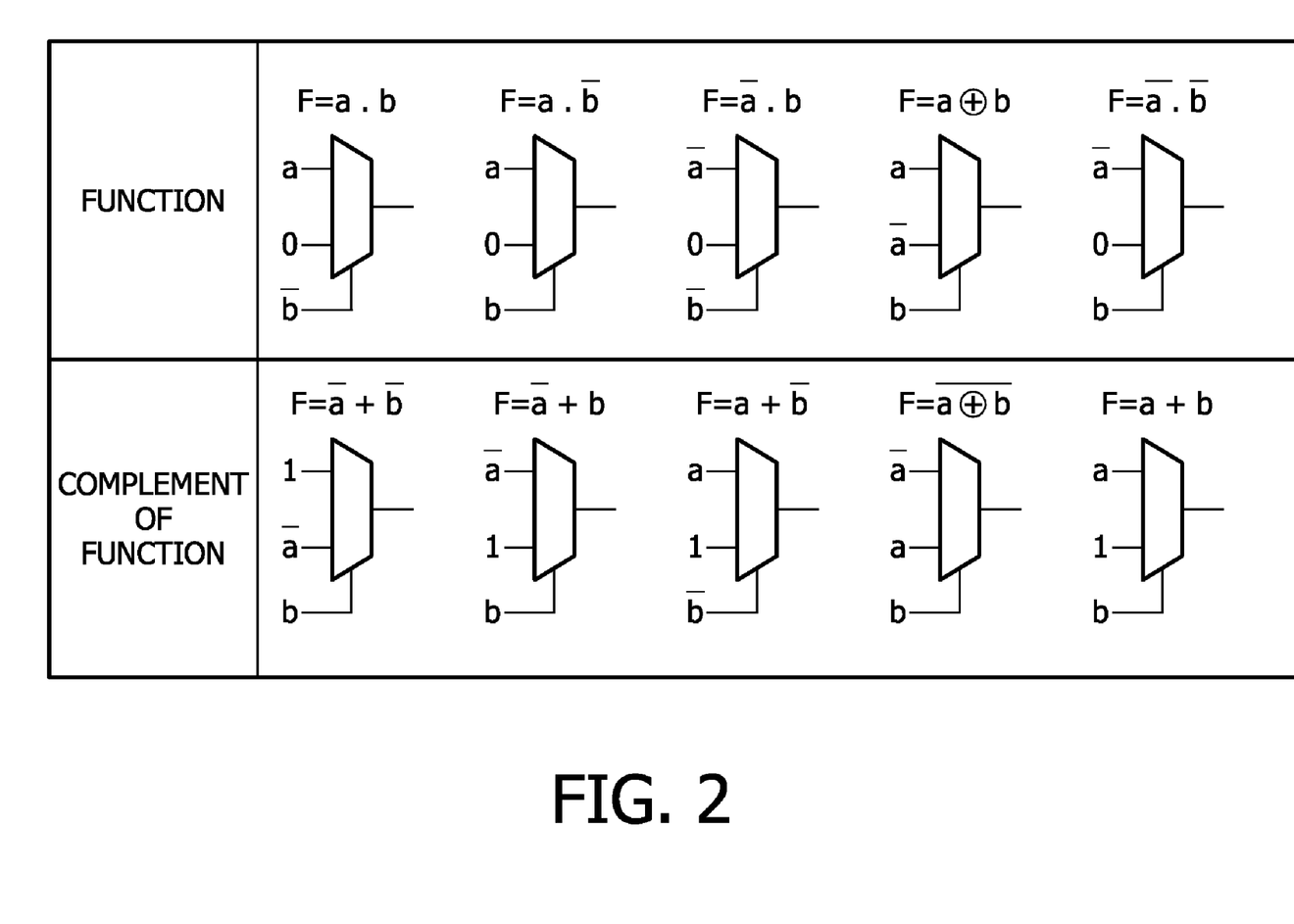
FIG. 2 is a table of all possible 2-input logic functions implemented with multiplexers.

It is known that multiplexers can be used inside programmable logic blocks to implement various logic functions. To provide full flexibility, it is necessary to consider all possible two-input logic functions which are listed below:

1. F=0
2. F=1
3. F=a
4. F=$\bar{a}$
5. F=b
6. F=$\bar{b}$
7. F=a.b
8. F=a.$\bar{b}$
9. F=$\bar{a}$.b
10. F=$\bar{a}$.$\bar{b}$
11. F=a+b
12. F=a+$\bar{b}$
13. F=$\bar{a}$+b
14. F=$\bar{a}$+$\bar{b}$
15. F=a⊕b
16. F=$\overline{a⊕b}$ Ten of the functions (functions 7 to 16) are dependent upon two input variables. However, five of these ten functions correspond to the complement of the other five functions. By choosing the functions and their complements as shown in FIG. 2, the size and number of multiplexers needed to implement the ten 2-input logic functions (functions 7 to 16) can be minimized. Only the top (or bottom) five functions of the table in FIG. 2 need to be implemented, since their complement functions can be generated using a programmable inverter.

Figure 3:
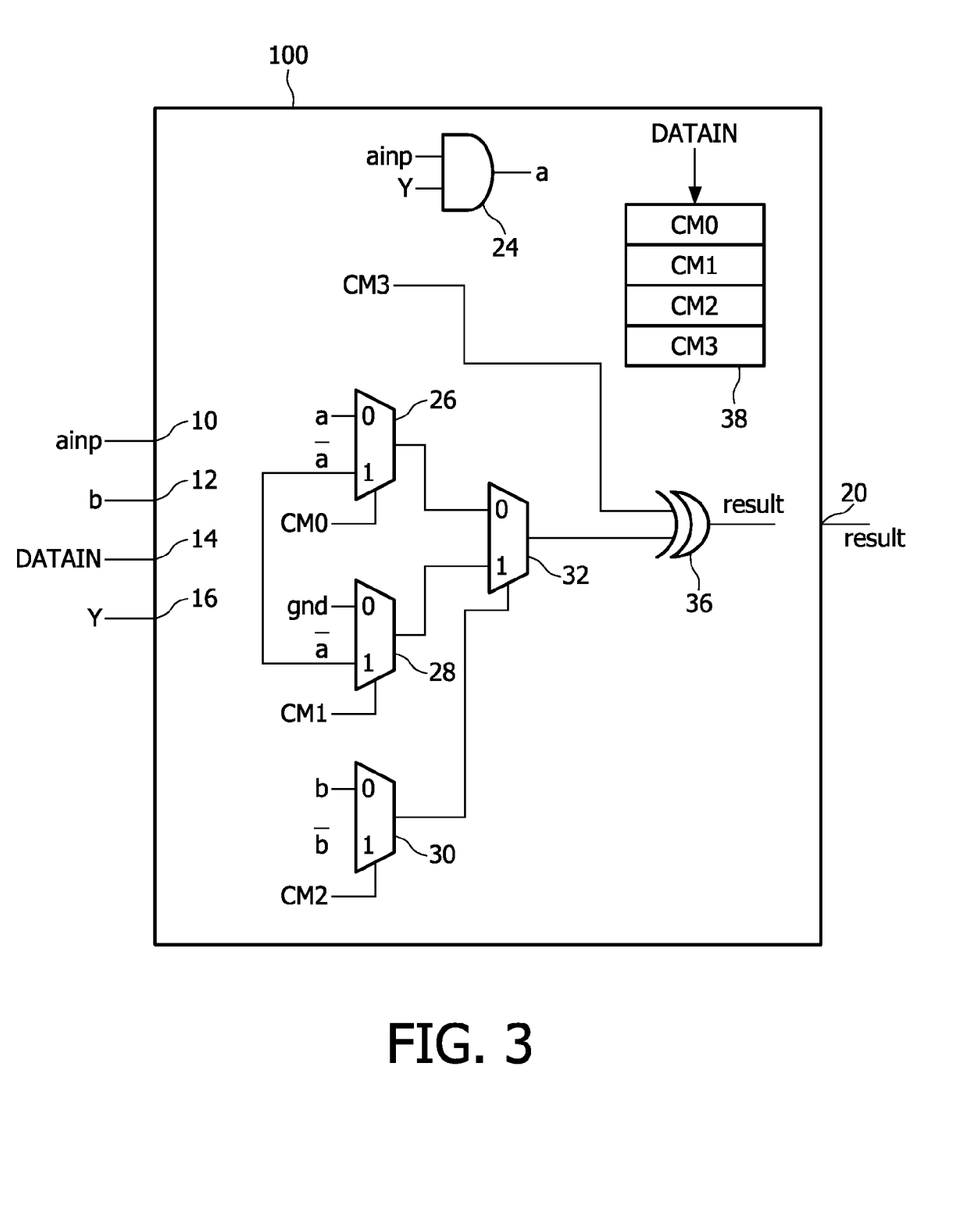
FIG. 3 is a schematic diagram of a logic module according to an embodiment of the invention.

Referring to FIG. 3, a logic module 100 according to an embodiment of the invention is shown. The logic module 100 comprises first to fourth input terminals 10,12,14,16, an output terminal 20, and control logic between the input terminals (10,12,14,16) and the at least one output terminal (20). The control logic comprises a plurality of multiplexer logic elements programmable to generate each of a first set of two-input logic functions and an inverter (36) programmable to produce from the first set, a second set of two-input logic functions which are the complement functions of the first set of two-input logic functions.

The control logic comprises a single two-input AND logic gate 24, first to fourth 2:1 multiplexers 26,28,30,32, a two-input XOR logic gate 36, and a 4-bit memory latch 38.

The four-bit memory latch 38 is connected to the third input terminal 14 to store the data signals applied to the third input terminal 14.

The first and fourth input terminals 10,16 are respectively connected to the first and second input terminals of the two-input AND logic gate 24. The AND gate 24 implements a logical AND of the data input applied to the first terminal 10 and the global configuration signal applied to the fourth input terminal.

The AND gate 24 selectively passes or suppresses the signal applied to the first input terminal 10 in response to the configuration signal applied to the fourth input terminal 16. The AND gate 24 outputs the signal applied to the first input terminal 10 when the potential of the configuration signal applied to the fourth input terminal 16 is at a high (1) level, and outputs a low potential (0) signal when the signal applied to the fourth input terminal 16 is at a low (0) level.

The first multiplexer 26 has its first and second signal terminals respectively connected to the output of the two-input AND logic gate 24 and the complement of the output of the two-input AND logic gate 24, the second signal terminal of the first multiplexer 26 also being connected to the second signal terminal of the second multiplexer 28. The selection terminal of the first multiplexer 26 is connected to the first bit CM0 of the four-bit memory latch 38. The first multiplexer 26 selects the complement of the output of the two-input AND logic gate 24 when a potential at the selection terminal of the first multiplexer 26 is at a high (1) level, and selects the output of the two-input AND logic gate 24 when the potential at the selection terminal of the first multiplexer 26 is at a low level (0).

The second multiplexer 28 has its first signal terminal connected to a ground potential/signal, and its selection terminal connected to the second bit CM1 of the four-bit memory latch 38. As detailed above, the second signal terminal of the first multiplexer 26 is connected to the second signal terminal of the second multiplexer 28. The second multiplexer 28 selects the complement of the output of the two-input AND logic gate 24 when a potential at the selection terminal of the second multiplexer 28 is at a high (1) level, and selects the ground potential/signal when the potential at the selection terminal of the second multiplexer 28 is at a low level (0).

The third multiplexer 30 has its first and second signal terminals respectively connected to the second input terminal 12 and the complement of the second input terminal 12, and the selection terminal of the third multiplexer 30 is connected to the third bit CM2 of the four-bit memory latch 38. The third multiplexer 30 selects the complement of the second input terminal 12 when a potential at the selection terminal of the third multiplexer 30 is at a high (1) level, and selects the second input terminal 12 when the potential at the selection terminal of the third multiplexer 30 is at a low level (0).

The signals selected by the first and second multiplexers 26 and 28 are respectively connected to the first and second signal terminals of the fourth multiplexer 32, and the signal selected by the third multiplexer 30 is connected to the selection terminal of the fourth multiplexer 32. The fourth multiplexer 32 selects an output signal of the second multiplexer 28 when a potential (an output signal of the third multiplexer 30) at the selection terminal of the fourth multiplexer 32 is at a high (1) level, and selects an output signal of the first multiplexer 26 when the potential (an output signal of the third multiplexer 30) at the selection terminal of the fourth multiplexer 32 is at a low level (0).

The two-input XOR logic gate 36 has one of its inputs connected to the signal selected by the fourth multiplexer 32 and the other of its inputs connected to the fourth bit CM3 of the four-bit memory latch 38. The XOR logic gate 36 acts as a programmable inverter by outputting the complement of a signal selected by the fourth multiplexer 32 when the potential (the fourth bit CM3 of the four-bit memory latch 38) is at a high level (1).

Alternatively, the programmable inverter may be any such suitably arranged component(s), for example a multiplexer that has the function and its complement as inputs and can be programmed to choose either of the inputs by a selection signal.

An output of the two input XOR logic gate 36 is directly output to the output terminal 20.

The logic module 100 can perform all sixteen possible 2-input logic functions, wherein the particular logic function performed is selected by selection and configuration signals applied to the third and fourth input terminals 14,16. The first to fourth multiplexers 26,28,30,32 are arranged to generate a first set of two-input logic functions, from which a particular function is selected according to the configuration signal applied to the fourth input terminal 16 and the respective values of the first three bits CM0, CM1, CM2 of the selection signal applied to the third input terminal 14 (CM0, CM1 and CM2 being stored by the four bit memory latch 38). A second set of two-input logic functions can then generated by inverting the corresponding first set of functions, this complementing procedure being selected according to the fourth bit CM3 of the selection signal applied to the third input terminal (CM3 being stored by the four bit memory latch 38).

As detailed above, when the potential of the fourth bit CM3 of the selection signal is at a high level (1), the XOR logic gate 36 acts as a programmable inverter, outputting the complement of a function generated by the first to fourth multiplexers 26,28,30,32.

For example, if the signals applied to the input terminal of the logic module are such that:

First Input Terminal 10='a';
Second Input Terminal 12='b';
Third Input Terminal 14=CM0='0', CM1='1', CM2='0', CM3='0'; and
Fourth Input Terminal 16='1', the AND gate 24 outputs the signal ('a') applied to the first input terminal 10, the first multiplexer 26 selects the output ('a') of the two-input AND logic gate 24, the second multiplexer 28 selects the output ('$\bar{a}$') of the two-input AND logic gate, and the third multiplexer 30 selects the signal applied to the second input terminal 12 ('b'). Thus, the signals 'a' and '$\bar{a}$' are respectively connected to the first and second signal terminals of the fourth multiplexer 32, and the signal 'b' is connected to the selection terminal of the fourth multiplexer 32. The fourth multiplexer 32 therefore generates the 2-input logic function "a⊕b" as its output. Since the potential of the fourth bit CM3 of the selection signal applied to the third input terminal 14 is at a low level (0), the two-input XOR logic gate 36 simply passes the signal selected by the fourth multiplexer 32 directly to the output terminal 20.

If, on the other hand, the potential of the fourth bit CM3 of the selection signal applied to the third input terminal 14 was a high level (1), the XOR logic gate 36 would acts as an inverter, outputting the complement of a signal selected by the fourth multiplexer 32 to the output terminal 20.

Figure 4:
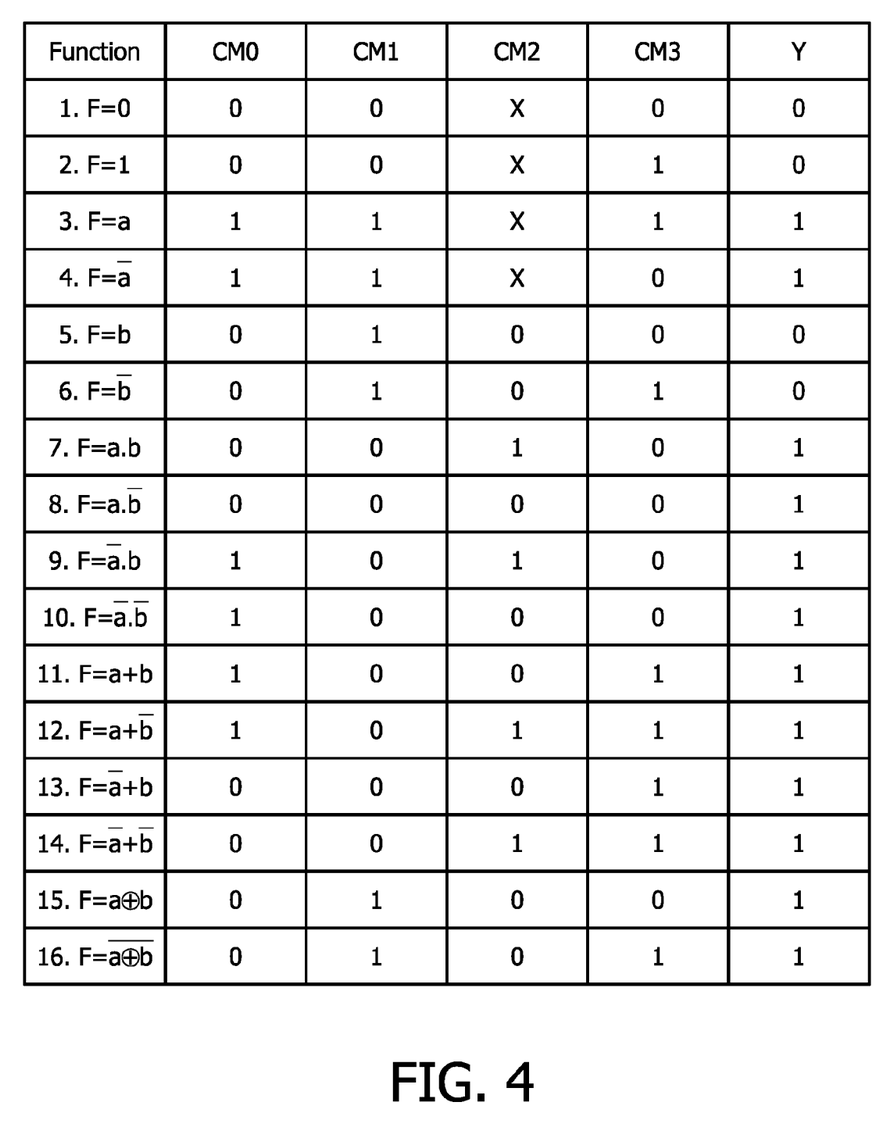
FIG. 4 is a table detailing the selection and configuration signals used to configure the logic module to generate each of the sixteen possible 2-input logic functions according to an embodiment of the invention.

As detailed above, the logic module 100 can implement any of the sixteen possible two-input logic functions, the particular logic function performed being selected by applying specific selection and configuration signals to the third and fourth input terminals 14,16. Referring to FIG. 4, a table detailing the selection and configuration signals used to configure the logic module 100 to generate each of the sixteen possible 2-input logic functions according to an embodiment of the invention is shown.

It will be seen that the AND gate 24 enables some functions to be implemented which are not available from for the multiplexers 26-32 alone.

Figure 5:
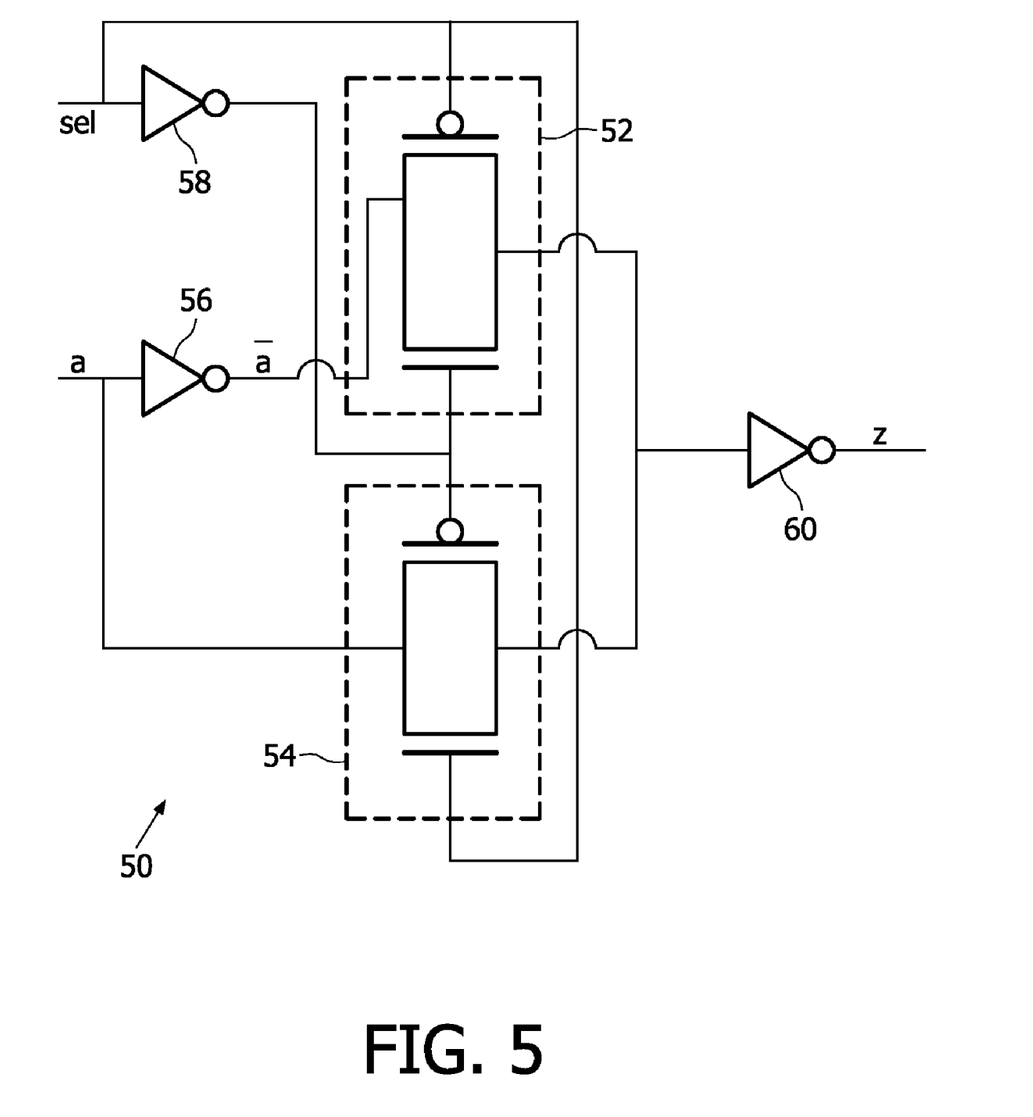
FIG. 5 illustrates a modified schematic of a 2:1 multiplexer from a typical standard-cell design library.

In FIG. 3, the complements of the signals output of the two-input AND logic gate 24 and the signals applied to the second input terminal 12 (the signals connected to the second terminals of the first, second and third multiplexers 26,28,30) are generated without any extra inverter. This is because the complemented version of a signal is already available from within the multiplexer, as shown in FIG. 5 which illustrates a modified schematic of a 2:1 multiplexer 50 from a typical standard-cell design library.

The 2:1 multiplexer 50 comprises first and second CMOS transmission gates 52,54 arranged such that the gate of the n-MOS transistor of the first transmission gate 52 is connected to the gate of the p-MOS transistor of the second transmission gate 54, and the gate of the pMOS transistor of the first transmission gate 52 is connected to the gate of the nMOS transistor of the second transmission gate 54. An input ('a') is connected directly to the source connection of the second transmission gate 54 and connected to the source connection of the first transmission gate 52 via a first inverter 56. A select signal ('sel') is connected directly to the pMOS gate of the first transmission gate 52 and connected to the nMOS gate of the first transmission gate 52 via a second inverter 58. The drain connections of the first and second transmission gate 52,54 are connected together and also connected to an output via a third inverter 60.

The multiplexer 50 outputs either the input signal ('a') or the complement of the input signal ('$\bar{a}$'), in response to a selection signal ('sel') applied to the selection terminal of the multiplexer 50. Thus, the first and third multiplexers 26 and 30 of the logic module 100 may each be implemented using the multiplexer 50 as described above and the signal and its complement are therefore available at no area overhead.

An alternative method of generating the complemented signal with no area overhead is to obtain it from the connection block multiplexers that precede the inputs. These connection block multiplexers can generate the signal and its inverse.

Figure 6:
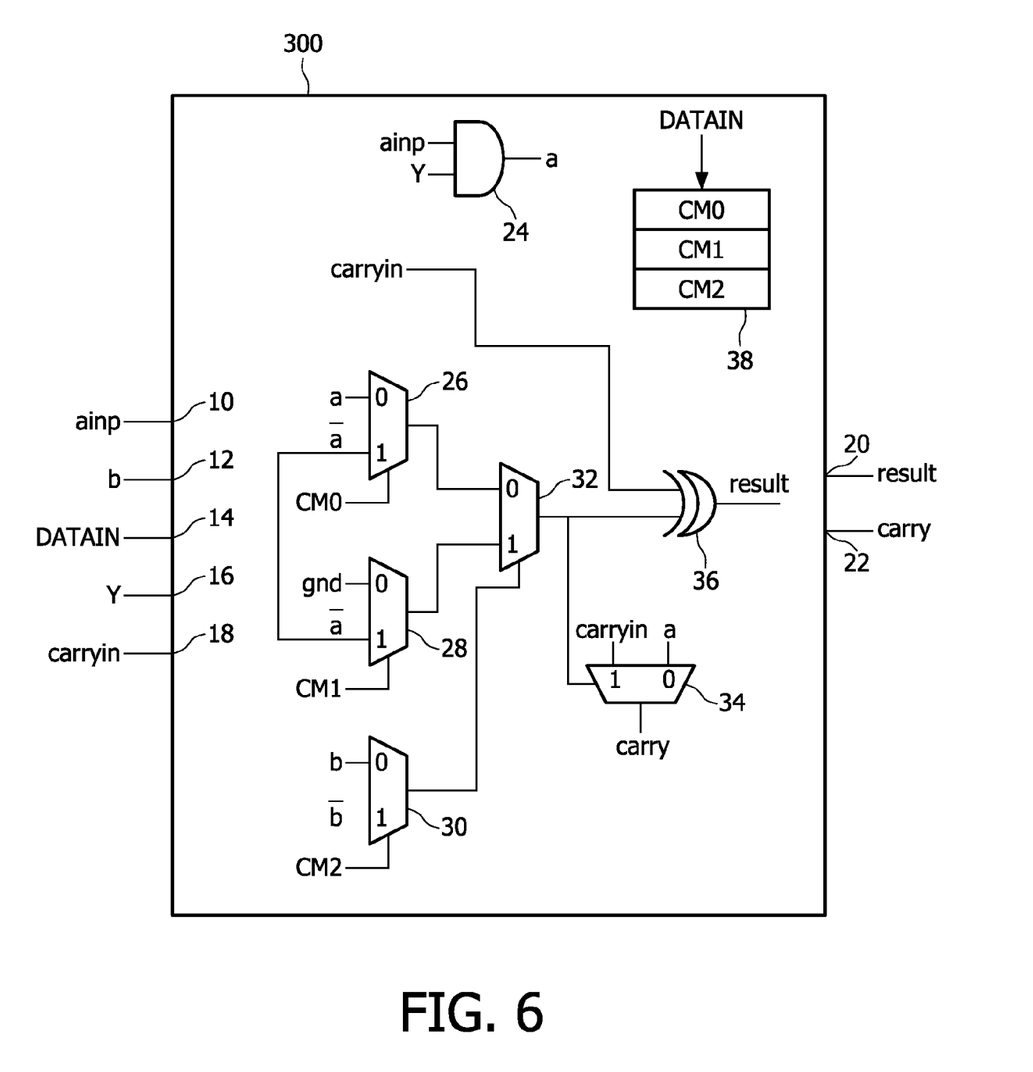
FIG. 6 is a schematic diagram of a logic module according to another embodiment of the invention.

Referring to FIG. 6, a logic module 300 according to another embodiment of the invention is shown. The same reference numerals and characters as those of FIG. 3 denote like components. The structure of the logic module 300 is generally the same as that of the logic module 100 of FIG. 3 except that it further comprises a fifth input terminal 18, a second output terminal 22, and a fifth 2:1 multiplexer 34.

Furthermore, as shown in FIG. 6, the fifth multiplexer 34 has its first and second signal terminals respectively connected to the output of the two-input AND logic gate 24 and the fifth input terminal 18, and the selection terminal of the fifth multiplexer 34 is connected to the signal selected by the fourth multiplexer 32. Thus, the fifth multiplexer 34 selects the fifth input terminal 18 when a potential at the selection terminal of the fifth multiplexer 34 is at a high (1) level, and selects the output of the two-input AND logic gate 24 when the potential at the selection terminal of the fifth multiplexer 34 is at a low level (0). The signals selected by the fifth multiplexer 34 are connected to the second output terminal 22.

In addition, the two-input XOR logic gate 36 now has one of its inputs connected to the signal selected by the fourth multiplexer 32 and the other of its inputs connected to the fifth input terminal 18.

A complete one-bit addition can be performed by logic module 300, by arranging the values of the first three bits CM0, CM1, CM2 of the selection signal applied to the third input terminal 14 (CM0, CM1 and CM2 being stored by the memory latch 38) such that CM0='0', CM1='1', CM2='0'.

The first output terminal 20 is arranged to output the 'sum' of the addition and the second output terminal 22 is arranged to output the 'carry' of the addition.

The input signal to the fifth input terminal 18 may act as a third Boolean input, being arranged to provide the 'carry-in' signal for complete one-bit addition. A logic module 300 may be arranged such that its second output terminal 22, which outputs the 'carry-out' signal of a complete one-bit addition, is connected to the fifth input terminal 18 of a second logic module 300, thus providing a 'carry-in' signal to the second logic module 300. A logic module 300 can therefore implement a bit-slice of datapath functions.

Figure 7:
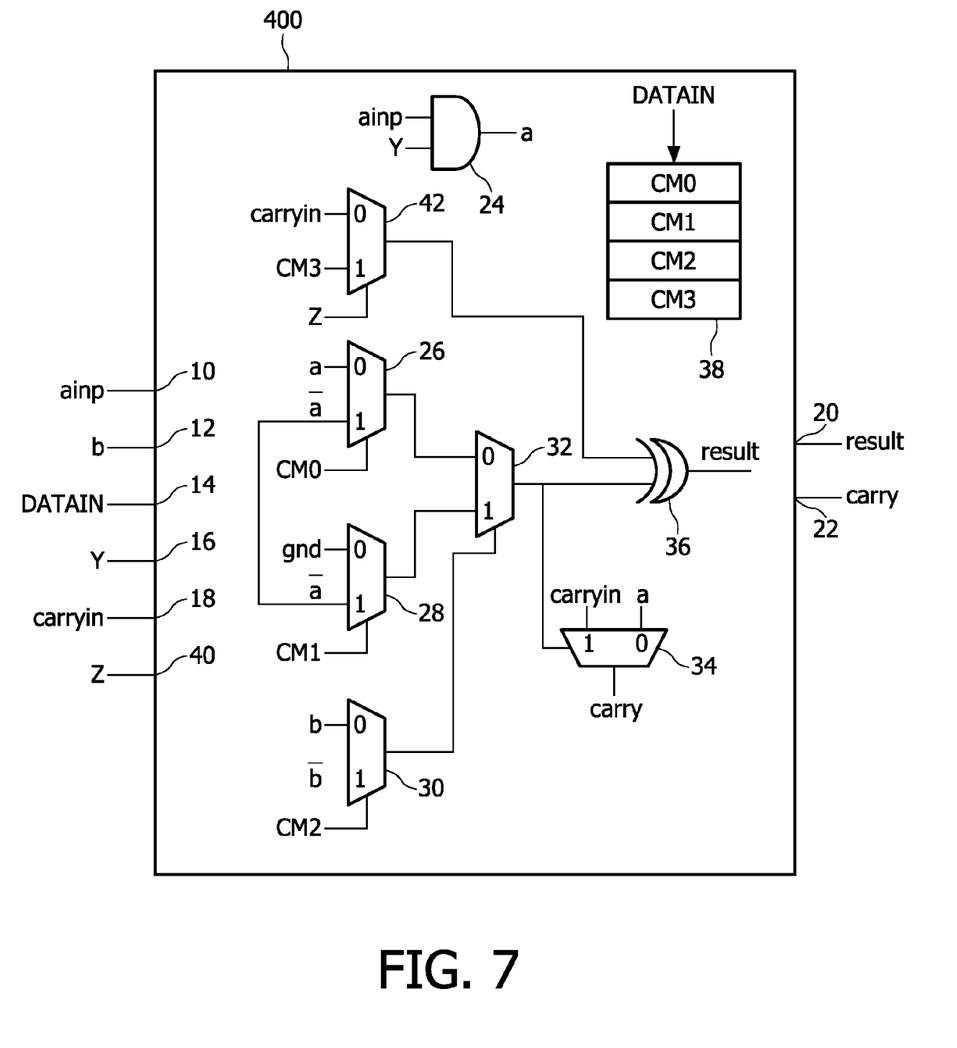
FIG. 7 is a schematic diagram of a logic module according to yet another embodiment of the invention.

Referring to FIG. 7, a logic module 400 according to yet another embodiment of the invention is shown. The same reference numerals and characters as those of FIGS. 3 and 6 denote like components. The structure of the logic module 400 is generally the same as that of the logic module 300 of FIG. 6 except that it further comprises a sixth input terminal 40 and a sixth 2:1 multiplexer 42.

Furthermore, as shown in FIG. 7, the sixth multiplexer 42 has its first and second signal terminals respectively connected to the fifth input terminal 18 and the fourth bit CM3 of the memory latch 38, and the selection terminal of the sixth multiplexer 42 is connected to the sixth input terminal 40. Thus, the sixth multiplexer 42 selects the fourth bit CM3 of the memory latch 38 when a potential at the selection terminal of the sixth multiplexer 42 is at a high (1) level, and selects the fifth input terminal 18 when the potential at the selection terminal of the sixth multiplexer 42 is at a low level (0).

In addition, the two-input XOR logic gate 36 now has one of its inputs connected to the signal selected by the fourth multiplexer 32 and the other of its inputs connected to the signals selected by the sixth multiplexer 42.

The logic module 400 combines the functionalities of both logic modules 100 and 300 detailed above. Thus, logic module 400 is a multiplexer-based logic module, or logic block slice, that is capable of implementing data-path and random logic. The logic module 400 therefore has two primary functional modes:

a) Data-path mode in which a datapath output is produced by generating a multibit result; and b) Random logic mode in which a single bit output is produced.

The sixth multiplexer 42 acts a selection unit, selecting between the two functional modes in response to a selection signal applied to the sixth input terminal 40. Only one of these modes is possible at the same time.

When a potential at the sixth input terminal 40 is at a high (1) level, the random logic mode is selected and the logic module 400 implements 2-input logic functions as described above, wherein the particular logic function performed is selected by a selection signal applied to the third input terminal 14.

When a potential at the sixth input terminal 40 is at a low (0) level, the data-path mode is selected. By arranging the values of the first three bits CM0, CM1, CM2 of the selection signal applied to the third input terminal 14 (CM0, CM1 and CM2 being stored by the memory latch 38) such that CM0='0', CM1='1', CM2='0', and CM3='0', a complete one-bit addition may then be performed as also described above.

Since the interconnect flexibility can be limited, SRAM memory cells may be used for configuration purposes and applying selection signals, thus realising a compact logic block that is also re-programmable.

Logic modules of the invention may find particular application for providing embedded re-configurability in System-On-Chips.

It should be noted that the above-mentioned embodiments illustrate rather than limit the invention, and that those skilled in the art will be able to design many alternative embodiments without departing from the scope of the claims. In the claims, any reference signs placed in parentheses shall not be construed as limiting the claim.

For example, a plurality of multiplexer logic elements and an inverter may be arranged to generate logic functions with more than two input variables. The multiplexer logic elements can be arranged to generate each of a first set of input logic functions (with more than two input variables) and the inverter arranged to produce from the first set, a second set of logic functions (with more than two input variables) which are the complement functions of the first set of logic functions.

The invention claimed is:

1. A logic module comprising:
a plurality of input terminals;
at least one output terminal; and
control logic between the input terminals and the at least one output terminal, the control logic comprising a plurality of multiplexer logic elements programmable to generate each of a first set of at least two-input logic functions and an inverter programmable to produce from the first set, a second set of at least two-input logic functions which are the complement functions of the first set of at least two-input logic functions.

2. A logic module according to claim 1, wherein the first and second set of at least two-input logic functions comprise all possible two-input logic functions.

3. A logic module according to claim 1, wherein the plurality of multiplexer logic elements comprise a plurality of 2:1 multiplexers.

4. A logic module according to claim 2 wherein the programmable inverter is a XOR logic gate.

5. A logic module according to claim 1, wherein the programmable inverter is a multiplexer, the multiplexer having its input signals connected to a function and the complement of the function and being arranged to output one of the input signals in response to a selection signal.

6. A logic module according to claim 1, wherein the control logic is further arranged to complete 1-bit addition.

7. A logic module according to claim 1, wherein the logic module is re-programmable.

8. The logic module according to claim 1 wherein the plurality of input terminals comprises:
first operand, second operand, first configuration and second configuration terminals;
the control logic comprise;
first to fourth 2:1 multiplexers; and
a two-input AND logic gate;
the inverter comprises a two-input XOR logic gate;
the logic module further comprising a memory latch;
wherein;
the memory latch is connected to the first configuration terminal;
the two-input AND logic gate has one of its inputs connected to the first operand terminal and the other of its inputs connected to the second configuration terminal;
the first 2:1 multiplexer has its two signal terminals respectively connected to the output of the two-input AND logic gate and the complement of the output of the two-input AND logic gate, and its selection terminal connected to a first bit of the memory latch, the second signal terminal of the first 2:1 multiplexer also being connected to the second signal terminal of the second 2:1 multiplexer;
the second 2:1 multiplexer has its first signal terminal connected to a ground signal, and its selection terminal connected to a second bit of the memory latch;
the third 2:1 multiplexer has its two signal terminals respectively connected to the second operand terminal and the complement of the second operand terminal, and its selection terminal connected to a third bit of the memory latch;
the fourth 2:1 multiplexer has its two signal terminals respectively connected to the signals selected by the first and second 2:1 multiplexers, and its selection terminal connected to the signal selected by the third 2:1 multiplexer;

the two-input XOR logic gate has one of its inputs connected to the signal selected by the fourth 2:1 multiplexer and the other of its inputs connected to a fourth bit of the memory latch; and the output terminal receives an output signal of the XOR logic gate.

9. A logic module according to claim 8, further comprising;

a carry-in terminal;

a fifth 2:1 multiplexer; and a second output terminal, wherein:

the two-input XOR logic gate has one of its inputs connected to the signal selected by the fourth 2:1 multiplexer and the other of its inputs connected to the carry-in terminal;

the fifth 2:1 multiplexer has its two signal terminals respectively connected to the output of the two-input AND logic gate and the carry-in terminal, and its selection terminal connected to the signal selected by the fourth multiplexer; and the second output terminal receives a signal selected by the fifth 2:1 multiplexer.

10. A logic module according to claim 9, further comprising a third configuration terminal and a sixth 2:1 multiplexer, wherein:

the sixth 2:1 multiplexer has its two signal terminals respectively connected to the carry-in terminal and a fourth bit of the memory latch, and its selection terminal connected to the third configuration terminal; and the two-input XOR logic gate has one of its inputs connected to the signal selected by the fourth 2:1 multiplexer and the other of its inputs connected to the signal selected by the sixth 2:1 multiplexer.

11. A semiconductor integrated circuit comprising at least one logic module according to claim 1.

12. A method of generating at least two-input logic functions from control logic, the control logic comprising a plurality of multiplexer logic elements and an inverter, the method comprising the steps of:

programming the plurality of multiplexer logic elements to generate each of a first set of at least two-input logic functions; and programming the inverter to produce from the first set, a second set of at least two-input logic functions which are the complement functions of the first set of at least two-input logic functions;

wherein said programming comprises writing data signals to a memory of the control logic and applying the data signals from the memory to the plurality of multiplexer logic elements and to the inverter.

13. A logic module according to claim 1, wherein the logic module comprises a memory latch connected to the plurality of multiplexer logic elements and to the inverter, said plurality of multiplexer logic elements and said inverter being re-programmable in response to said memory latch.

14. A logic module comprising:

a plurality of input terminals;

at least one output terminal; and control logic between the input terminals and the at least one output terminal, the control logic comprising a plurality of multiplexer logic elements programmable to generate each of a first set of at least two-input logic functions and an inverter programmable to produce from the first set, a second set of at least two-input logic functions which are the complement functions of the first set of at least two-input logic functions;

wherein the control logic comprises a re-programmable memory connected to the plurality of multiplexer logic elements and to the inverter, said plurality of multiplexer logic elements and said inverter being re-programmable in response to said re-programmable memory.

* * * * *